United States Patent [19]

Roscoe

[11] Patent Number: 5,761,030
[45] Date of Patent: Jun. 2, 1998

[54] ELECTRONIC DEVICE WITH CIRCUIT BOARD LATCHING AND RETAINING STRUCTURE

[75] Inventor: Brett D. Roscoe, Houston, Tex.

[73] Assignee: Compaq Computer Corporation, Houston, Tex.

[21] Appl. No.: 666,812

[22] Filed: Jun. 19, 1996

[51] Int. Cl.$^6$ ................................. G06F 1/16; H05K 7/12
[52] U.S. Cl. .................... 361/684; 361/759; 361/801; 312/333
[58] Field of Search .................... 361/683–686, 361/724–727, 732, 740, 759, 801, 825; 312/333; 364/708.1; G06F 1/16

[56] References Cited

U.S. PATENT DOCUMENTS

| | | | |
|---|---|---|---|
| 4,392,697 | 7/1983 | Kousens | 312/333 |
| 4,979,909 | 12/1990 | Andrews | 439/352 |
| 5,277,615 | 1/1994 | Hastings et al. | 361/725 |
| 5,317,483 | 5/1994 | Swindler | 361/801 |
| 5,394,305 | 2/1995 | Moral et al. | 361/759 |
| 5,398,162 | 3/1995 | Bice | 361/732 |
| 5,460,441 | 10/1995 | Hastings et al. | 361/727 |
| 5,513,069 | 4/1996 | Ohgami et al. | 361/685 |
| 5,549,375 | 8/1996 | Pagliaccio | 361/727 |
| 5,594,627 | 1/1997 | Le | 361/801 |
| 5,601,349 | 2/1997 | Holt | 361/683 |
| 5,668,696 | 9/1997 | Schmitt | 361/685 |

*Primary Examiner*—Lynn D. Feild
*Attorney, Agent, or Firm*—Konneker & Smith, P.C.

[57] ABSTRACT

An enhanced accessibility router includes an outer housing with a side wall opening through which a support tray man be inserted into the housing interior and removed therefrom. A variety of printed circuit boards, including a system I/O board, a CPU card, and various option cards are mounted on the tray for movement therewith. At the back end of the support tray is a specially designed latch and card support member which functions to releasably hold the tray in an outwardly withdrawn position thereof and to receive and support edge portions of the CPU card and option cards. The CPU card is captively retained on the tray by an elongated card retaining member that may be quickly and easily installed on and removed from the tray without tools. A front housing wall has an opening disposed therein and facing a PCMCIA card support structure mounted on the inner end of the support tray. When the tray is fully inserted into the housing interior the PCMCIA card support structure enters the front housing wall opening and is positioned to receive a PCMCIA card inserted rearwardly therethrough. Accordingly, access to the PCMCIA card support structure is provided through the front side of the housing when the tray is fully inserted, and from the rear side of the housing when the tray is pulled outwardly from the housing.

24 Claims, 6 Drawing Sheets

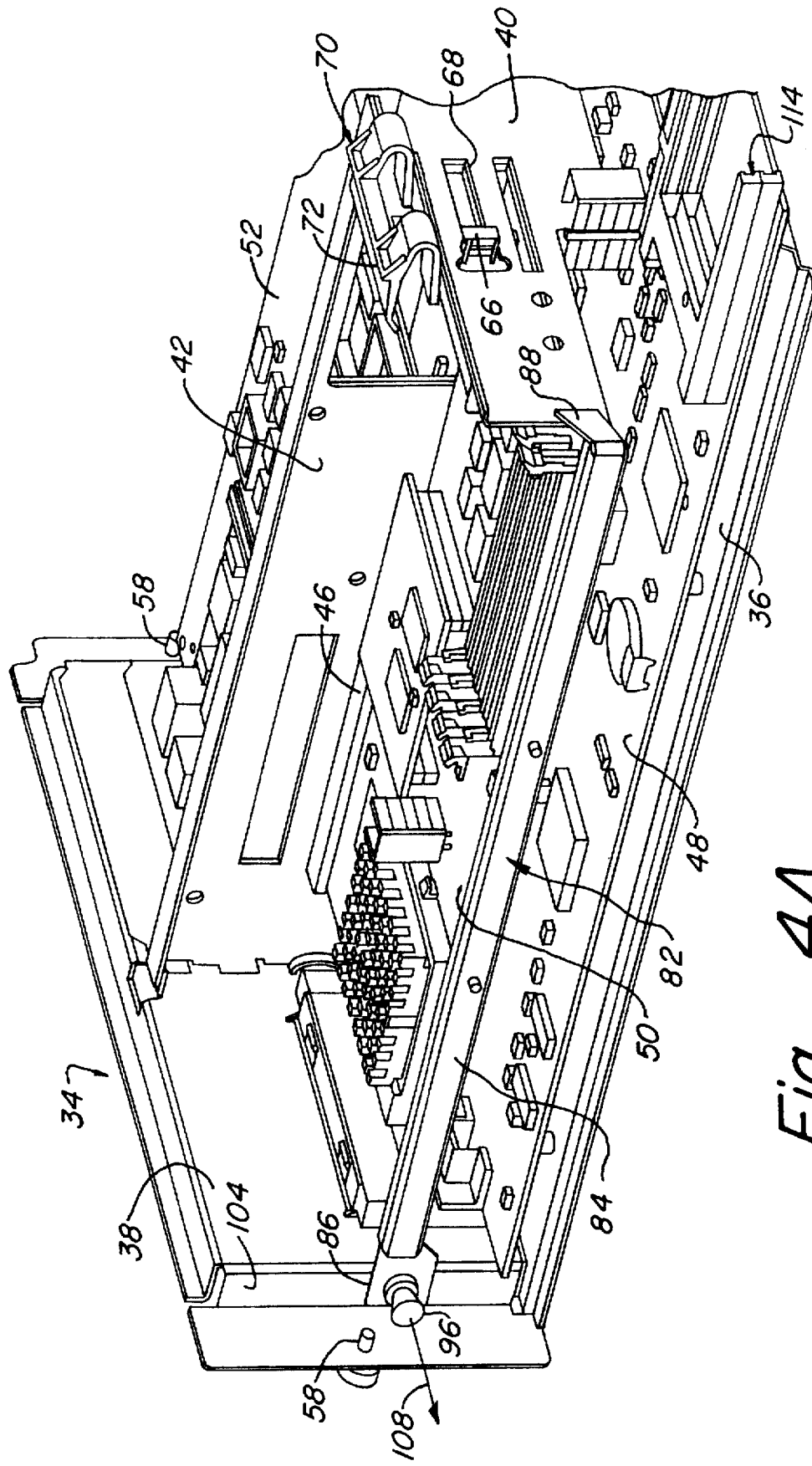

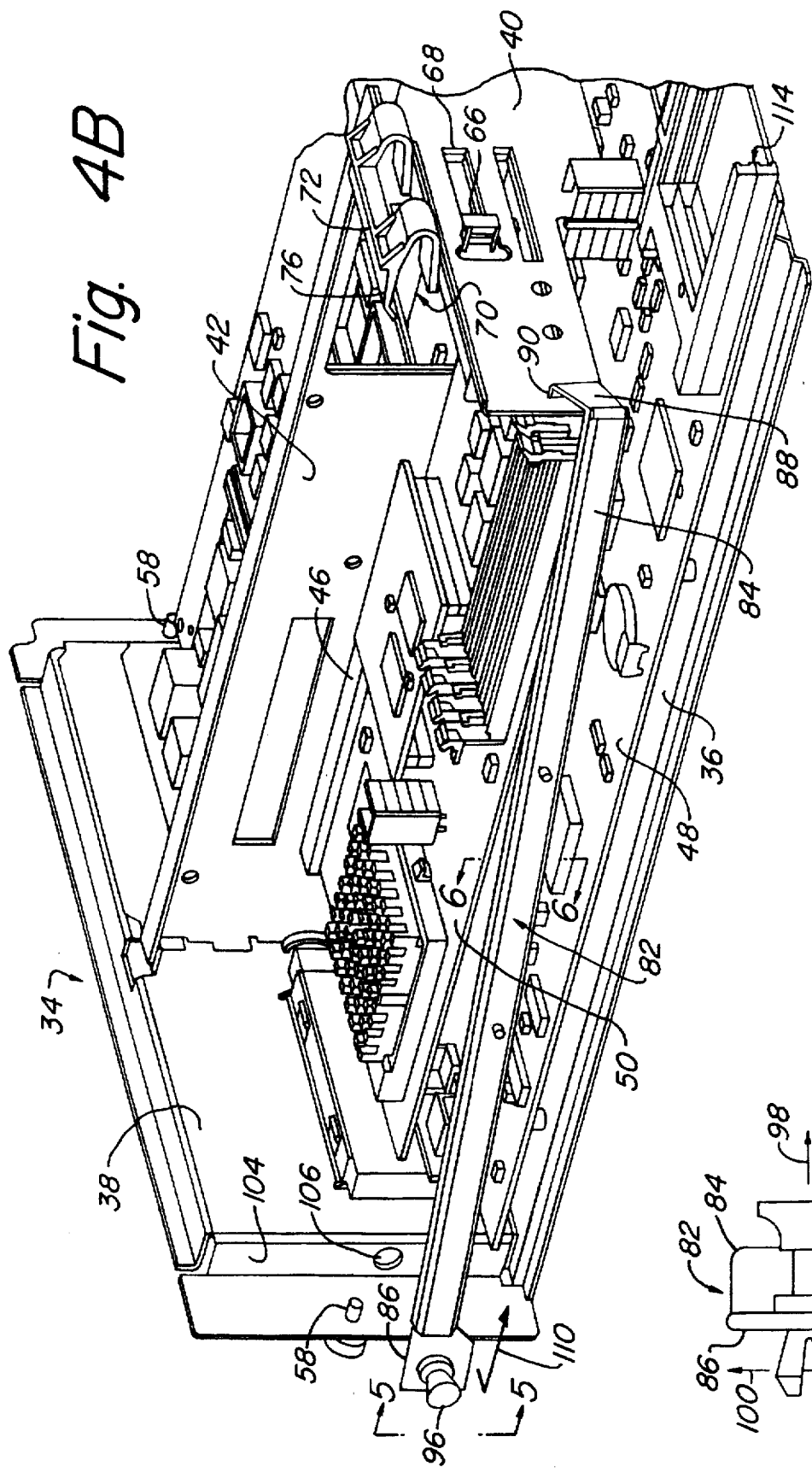

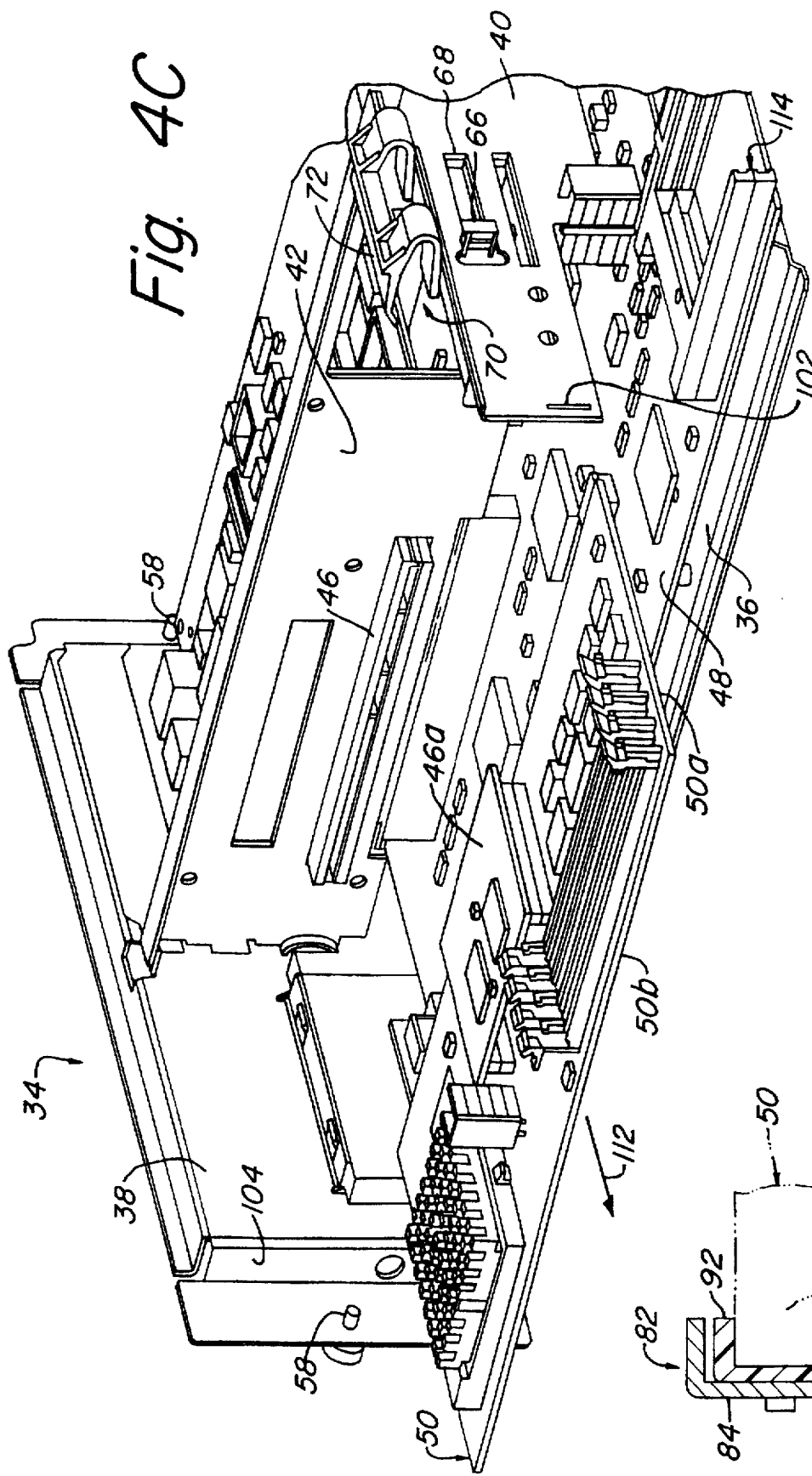

ELECTRONIC DEVICE WITH CIRCUIT BOARD LATCHING AND RETAINING STRUCTURE

BACKGROUND OF THE INVENTION

1. Field of the Invention

This invention generally relates to electronic apparatus and, in a preferred embodiment thereof, more particularly relates to computer apparatus, such as a router, provided with various access and serviceability improvements.

2. Description of Related Art

A router is a printed circuit board-based computer device typically used to route electronic signals from, for example, one LAN (local area network) to another LAN, or from a LAN to a WAN (wide area network). As opposed to a switch box, which receives a pre-addressed signal and then appropriately routes the incoming signal, the router reformats the incoming signal based upon the following criteria— outgoing network type, communication protocol used in incoming signal, state of outgoing network ports, and shortest and/or best paths available to reach the destination network mode.

In common with other PCB-based computer devices, the typical router includes a variety of printed circuit boards operatively disposed within an outer housing structure. Also in common with other PCB-based computer devices, the access to the individual circuit boards within the router, for repair, replacement and upgrading can be difficult, tedious, time consuming and awkward. For example, the circuit boards in routers of conventional design and configuration are typically secured to a pull-out internal tray portion of the router which is removably secured to its housing by, for example, various screws.

However, once the tray is unscrewed from the housing it can simply fall out of the housing, thereby often making the work on the tray-supported circuit boards awkward unless the tray is completely removed and rested on a suitable work surface. Also, the CPU portion of the router is typically on the system I/O board and requires special tools to remove once the I/O board is removed. Aggravating the access problem in conventional routers and other PCB-based computer devices is the usual necessity of using various other tools to remove and/or install other circuit board portions of the device.

Another access problem in a conventionally configured router is presented in conjunction with its PCMCIA card portion. Specifically, to install or remove a PCMCIA card from a conventionally configured router it typically necessary to remove a housing wall (usually the top housing wall) to gain access to an internal PCMCIA card area, and then replace the housing wall.

As can readily be seen from the foregoing, it would be quite desirable to provide a housing disposed, PCB-based electronic apparatus, such as a router, with access improvements that eliminate or at least substantially reduce the above-mentioned problems, limitations and disadvantages commonly found in routers or other PCB-based electronic apparatus of conventional construction and configuration. It is accordingly an object or the present invention to provide such enhanced accessibility electronic apparatus.

SUMMARY OF THE INVENTION

In carrying out principles of the present invention, in accordance with a preferred embodiment thereof, enhanced accessibility electronic apparatus, representatively in the form of a router, is provided.

The electronic apparatus includes a housing having an exterior wall opening; a support structure, representatively in the form of a support tray structure, movable into and out of the interior of the housing through the exterior wall opening, and a circuit board carried by the support structure for movement therewith.

According to one aspect of the invention, a specially designed latch structure is carried by the support structure for movement therewith and is positioned and configured to cooperate with the housing in a manner releasably preventing the removal of the support structure from the housing outwardly through its exterior wall opening. The latch structure also has a support section releasably engaging and supporting a portion, preferably an edge portion, of the circuit board. The latch structure is representatively a one piece plastic molding, with the support and latch portions being formed integrally with one another, and is conveniently and releasably snap-fitted onto the appropriate portion of the support structure.

This combination latch and card edge support structure facilitates access to the circuit board, representatively a CPU card, by permitting the support structure to be pulled outwardly from the housing, while still being supported thereon, to expose the circuit board for inspection and servicing.

According to another aspect of the invention the circuit board is removable from the support structure in a first direction, and the electronic apparatus includes a retainer stabilizer structure removably secured to the support structure and blocking the removal of the circuit board therefrom in the first direction. The retainer structure is of a toolless construction permitting it to be manually installed on and removed from the support structure without using a tool. Incorporated in the retainer structure is a support section releasably engaging and supporting an edge portion of the circuit board.

In an illustrated preferred embodiment thereof, the retainer structure includes an elongated body portion having, with the retainer structure installed on the support structure, first and second ends spaced apart in a second direction parallel to the plane of the circuit board and transverse to the first direction. Mounted on the first body end is an expandable grommet removably received in an opening in a first portion of the support structure. Formed on the second body end is a tab that is releasably received in a corresponding slot in a second portion of the support structure. A support section attached to the body received and supports an edge portion of the circuit board.

To remove the circuit board, without any tools, a service person simply retracts the grommet by outwardly pulling an associate expansion plunger, pivots the retainer body outwardly from the retained circuit board edge to free it from the retainer structure, pulls the opposite end tab out of its associated support structure slot, and removes the now freed circuit board from the support structure.

According to another access enhancing feature of the invention, a computer card receiving structure, representatively a PCMCIA card receiving structure, is secured to an inner end portion of the support structure for movement into and out of the housing through the aforementioned exterior wall opening which is formed in a first exterior side wall of the housing. Spaced apart from and generally facing the first exterior housing side wall is a second housing exterior side wall with a PCMCIA card insertion slot therein.

When the support structure is inserted into the housing to an operatively installed position therein, the PCMCIA card receiving structure is positioned adjacent the slot so that a PCMCIA card may be inserted into and removed from the card receiving structure via the insertion slot. Additionally, when the support structure is removed from the housing access to the receiving structure, for PCMCIA card insertion and removal, is provided. Accordingly, insertion and removal access to the card receiving structure is conveniently provided at two opposite exterior side wall portions of the housing.

BRIEF DESCRIPTION OF THE DRAWINGS

FIG. 2A is an enlarged scale perspective detail view of the circled area "2A" in FIG. 2;

FIGS. 4A–4C are enlarged scale partial perspective views of the support tray portion and sequentially illustrate the operation of a specially designed toolless circuit board retaining member in captively retaining, and then permitting the removal of, a tray supported circuit board;

FIG. 5 is an enlarged scale end view of the retaining member taken along line 5—5 of FIG. 4B;

FIG. 6 is an enlarged scale cross-sectional view through the retaining member taken along line 6—6 of FIG. 4B;

FIG. 7 is an enlarged scale cross-sectional view through a rear end portion of the support tray portion taken along line 7—7 of FIG. 3; and FIG. 8 is an enlarged scale cross-sectional view through a rear end portion of the support tray portion taken along line 8—8 of FIG. 3.

DETAILED DESCRIPTION

Figure 1:
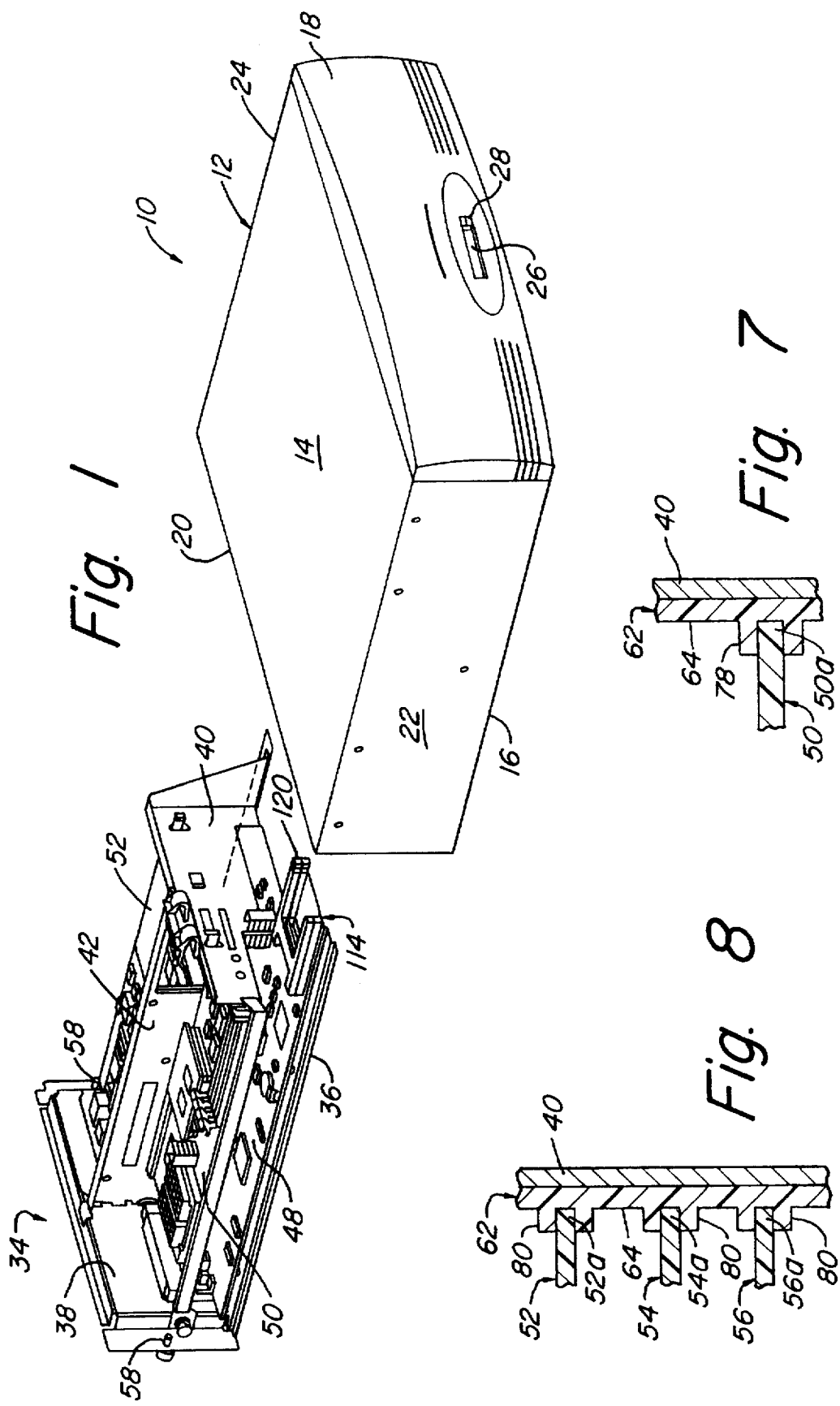
FIG. 1 is a partially exploded perspective view of a printed circuit board-based electronic apparatus, representatively a router, incorporating principles of the present invention.
Figure 3:
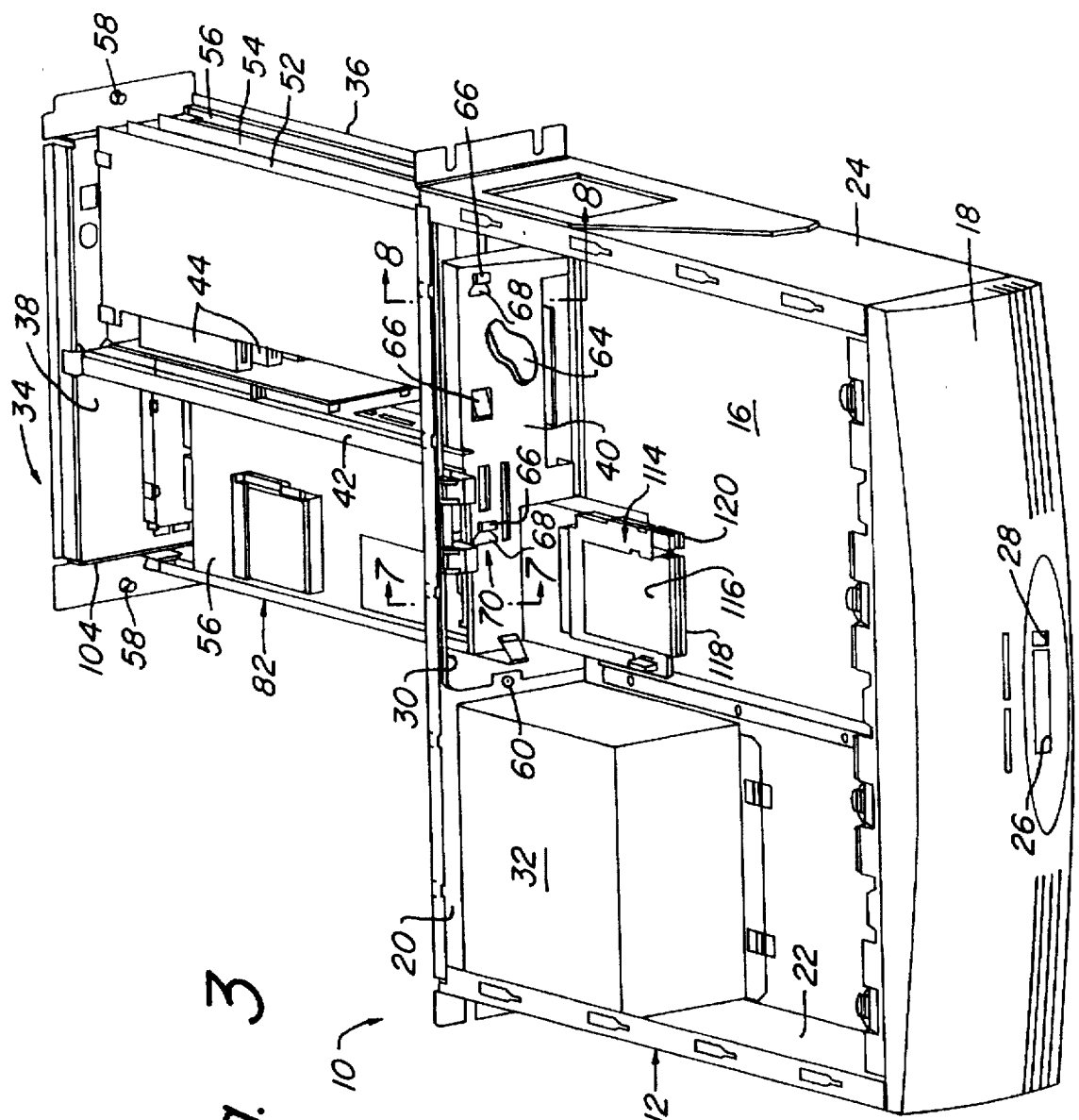
FIG. 3 is an enlarged scale top side perspective view of the router, with its top housing wall removed and its circuit board support tray portion pulled out to its stopped position as in FIG. 2.

Referring initially to FIGS. 1 and 3, the present invention provides an enhanced accessibility, printed circuit board-based electronic apparatus which is representatively in the form of a router 10. The router 10 includes a hollow rectangular housing 12 having a horizontal top wall 14 (removed in FIG. 3), a horizontal bottom wall 16, vertical front and rear walls 18 and 20, and vertical left and right side walls 22 and 24. Front wall 18 has a PCMCIA card insertion and removal slot 26 and an adjacent ejector button receiving slot 28 formed therein, and the rear wall 20 has a horizontally elongated rectangular tray insertion and removal opening 30 formed therein immediately to the right of a power supply unit 32 (see FIG. 3) operatively mounted in a rear interior portion of the housing 12.

Referring now to FIGS. 1–4C, the router 10 also includes a support tray structure 34 having a rectangular base wall 36 elongated in a front-to-rear direction, a rear or outer upstanding end wall 38, an upstanding front or inner end wall 40 spaced forwardly apart from the wall 38, and an upstanding back plane support wall 42 extending centrally along the support tray structure 34 transversely between the end walls 38 and 40 and having electrical connectors 44,46 on its opposite sides (see FIGS. 3 and 4C).

Various printed circuit boards are carried on the tray structure 34. Representatively, these printed circuit boards include a main system I/O board 48 disposed on the top side of the base tray wall 36; a CPU board 50 positioned above and parallel to the board 48 on one side of the back plane support wall 42 and having a connector portion 46a (see FIG. 4C) removably coupled to the connector 46; and three vertically stacked option cards 52,54,56 (see FIG. 3) positioned on the other side of the back plane support wall 42 and removably edge-coupled to the associated connectors 44.

The support tray structure 34 is movable through the housing rear side wall opening 30 between the outwardly extended access and service position of the tray structure 34 shown in FIG. 3, in which a subsequently described latch structure releasably prevents the tray 34 from being completely removed from the housing 12, and an forwardly inserted position in which the tray body and its supported circuit boards are operatively received in the housing interior. In this latter tray position the tray is captively retained in the housing interior by trapped thumb screws 58 carried on horizontally opposite ends of the rear tray wall 38 and threaded into corresponding openings 60 (see FIG. 2) in the rear housing wall 20.

The support tray structure 34 is releasably prevented from being rearwardly moved from its FIG. 3 access and service position by a specially designed combination latch and circuit board support member 62 (see FIG. 2A) which is representatively of a unitary, molded plastic construction and is releasably connected to the rear side of the upstanding front tray end wall 40. Member 62 has a plate-like rectangular body section 64 (see FIG. 2A) with resilient tab portions 66 (see FIG. 3) formed on its rear side. To removably secure the member 62 to the rear side of the tray wall 40 the tabs 66 are forwardly and removably snapped into place within corresponding openings 68 formed in the front tray end wall 40.

Formed on the upper side edge of the body section 64 of the member 62, and projecting forwardly therefrom, is a resilient latch portion 70 having a horizontal top wall with a rearwardly facing ledge 72 formed thereon as best illustrated in FIG. 2A. As the tray structure 34 is pulled rearwardly out of the housing 12 to its FIG. 3 outwardly extended access and service position, the ledge 72 is rearwardly brought into abutment with the inner side surface of a top side lip portion 74 of the rear side housing opening 30 (see FIG. 2A), thereby preventing further outward movement of the support tray structure 34 and conveniently supporting the now exposed tray structure 34 on the rear side of the housing 12 to facilitate servicing of the various tray-supported circuit boards.

Figure 2:
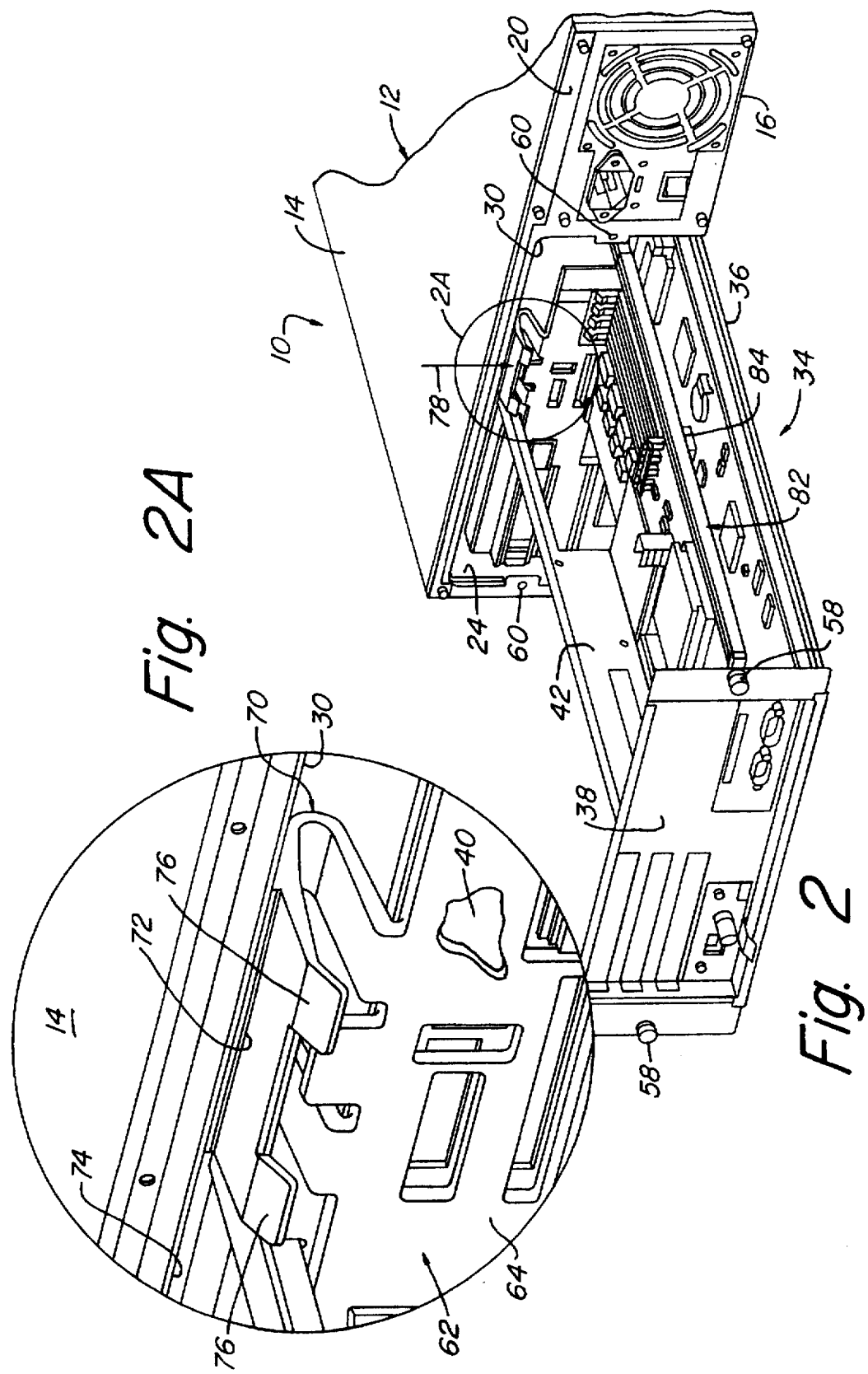
FIG. 2 is an enlarged scale partial rear side perspective view of the router with a circuit board support tray portion thereof pulled out to a stopped position thereof.

If desired, the tray structure 34 may be easily removed from the housing 12 simply by pushing down on two release tab portions 76 of the latch structure 70 (see FIG. 2A) as indicated by the arrow 78 in FIG. 2. This downwardly deflects the top wall portion of the latch 70, thereby downwardly moving the ledge 72 out of blocking abutment with the opening lip 74 and freeing the tray structure 34 for removal from the housing 12.

The member 62 facilitates the accessibility and serviceability of the tray-mounted circuit boards in yet another manner by providing front edge support for the CPU board 50 and the option cards 52,54,56 without the conventional necessity of providing such support using screws or other separate fastening members. As best illustrated in FIGS. 7 and 8, this accessibility advantage is provide by the member 62 by means of horizontally elongated channel projections 78 and 80 formed on the rear side of the body section 64 of the combination latch and circuit board support member 62. As shown in FIG. 7, the channel projection 78 removably and supportingly receives a front edge portion 50a of the CPU board 50, and as shown in FIG. 8, the channel projections 80 removably and supportingly receive front edge portions 52a,54a,56a of the option cards 52,54,56.

Referring now to FIGS. 4A–6, according to another accessibility and serviceability enhancement feature of the present invention, the CPU board 50 is captively and releasably retained in its installed orientation on the support tray structure 34 by means of a specially designed toolless retainer member 82, the term "toolless" meaning in this context that it may be installed and removed without the use of any sort of tool.

Retainer member 82 representatively has an elongated metal body portion 84 with a generally U-shaped cross-section along its length, a generally plate-shaped rear end portion 86, and a rearwardly bent front end portion 88 having an outer end tab 90 thereon (see FIG. 4B). When the body portion 84 is installed on the tray structure 34 the length of the body portion 84 is horizontally oriented with the concave side of the body portion 84 facing the outer side edge 50b (see FIG. 4C) of the CPU board 50. For purposes later described, an elongated plastic channel member 92 (see FIG. 6) is anchored in a nested, parallel relationship within the interior of the retainer member body portion 84.

As best illustrated in FIG. 5, at the rear end of the retainer member body 84 an expandable plastic grommet member 94 is captively retained in a suitable opening formed in the rear body end portion 86 and movably receives an associated plastic expansion plunger member 96. The plunger member 96 may be pushed into the grommet 94, as indicated by the arrow 98 in FIG. 5, to laterally expand the grommet as indicated by the arrows 100, or pulled out of the grommet to allow it to resiliently retract in a lateral direction opposite to the direction of arrows 100.

With the retainer member 82 removed from the tray structure 34 the CPU board 50 is installed by sliding its front edge portion 50a inwardly along the latch member channel projection 78 (see FIG. 7) until the board edge connector portion 46a mates with the connector 46 (see FIG. 4C). Next, the front end tab 90 of the retainer member (see FIG. 4B) is rearwardly inserted into a corresponding vertical slot 102 (see FIG. 4C) formed in the front tray end wall 40 and, with the plunger 96 pulled outwardly from the grommet 94, the retainer member body portion 84 is pivoted toward the side edge 50b of the CPU board 50 in a manner causing the board side edge 50b to enter and be supported by the channel member 92 as illustrated in phantom in FIG. 6.

As the rear end 86 of the retainer member body 84 inwardly approaches a vertical transverse tab portion 104 of the rear tray end wall 38 the laterally retracted grommet 94 is passed into and through a circular opening 106 in the tab portion 104 (see FIG. 4B). The plunger 98 is then pushed in to laterally expand the grommet 94, thereby captively retaining the opposite ends of the retainer member on the tray structure 34. In this manner, both the CPU board 50 and the retainer member 82 are rapidly and easily installed without tools, and the installed retainer member 82 both captively retains and supports the installed CPU board 50.

The retainer member 82 may be just as easily removed, without any tools, to thereby permit the rapid removal of the CPU board 50, also without tools, as sequentially illustrated in FIGS. 4A–4C. First, as indicated by the arrow 108 in FIG. 4A, the plunger 96 is pulled outwardly to permit the grommet 94 to laterally retract and pass outwardly through the opening 106 in the housing wall tab 104.

Next, the now freed rear end of the retainer member body 84 is pivoted outwardly away from the tab wall 104, and the body 82 is pushed forwardly (as indicated by the arrow 110 in FIG. 4B) to release its front end tab 90 from the associated slot 102 in the front tray end wall 40. The retaining member 82 is then set aside and, as indicated by the arrow 112 in FIG. 4C, the CPU board 50 is simply pulled outwardly from the tray structure 34 to unplug the board and remove it from the tray for servicing, replacement or upgrading.

Turning now to FIG. 3, according to another access and service enhancement feature of the present invention a generally U-shaped PCMCIA card support structure 114, of conventional design, is suitably secured to a bottom portion of the tray structure 34 and projects forwardly beyond its inner end wall 40. The card support structure 114 is representatively configured to receive upper and lower PCMCIA cards 116,118 and has a forwardly projecting ejector button 120. When the support tray structure 34 is fully inserted into the interior of the housing 12, the ejector button 120 projects outwardly through the opening 28 on the front housing wall 18, and the front end of the card support structure 114 is inwardly adjacent the card opening 26.

Thus, when the support tray structure 34 is fully inserted into the housing 12 access to the card support structure 114 is provided at the front side of the router 10 via the front housing side wall opening 26. Additionally, access to the card support structure 114, for inserting or removing PCMCIA cards, is provided at the back of the router 10 by simply removing the support tray structure 34. As can readily be seen, this is a substantial access and serviceability improvement over a conventionally configured router of the type in which access to its PCMCIA card support structure can be obtained only by removing the top side wall of its housing.

The foregoing detailed description is to be clearly understood as being given by way of illustration and example only, the spirit and scope of the present invention being limited solely by the appended claims.

What is claimed is:

1. Electronic apparatus comprising:
   a housing having an exterior wall opening;
   a support structure movable into and out of the interior of said housing through said exterior wall opening;
   a circuit board carried by said support structure for movement therewith; and
   a latch structure carried by said support structure for movement therewith and being positioned and configured to cooperate with said housing in a manner releasably preventing the removal of said support structure from said housing outwardly through said exterior wall opening, said latch structure having a support section releasably engaging and supporting a portion of said circuit board.

2. The electronic apparatus of claim 1 wherein said electronic apparatus is a computer apparatus.

3. The electronic apparatus of claim 2 wherein said computer apparatus is a router.

4. The electronic apparatus of claim 1 wherein:
   said support structure has an inner end portion, and
   said latch structure is secured to said inner end portion and has a resiliently deflectable section positioned to abut a peripheral housing wall portion bordering said wall opening when said support structure is pulled outwardly through said exterior wall opening.

5. The electronic apparatus of claim 4 wherein:

said latch structure has a body portion formed integrally with said resiliently deflectable section and secured to said inner end portion of said support structure, said support section being formed on said body portion and releasably engaging and supporting an edge portion of said circuit board.

6. The electronic apparatus of claim 5 wherein:

said latch structure is a one piece plastic molding, and said support section defines an elongated channel structure releasably receiving said circuit board edge portion.

7. The electronic apparatus of claim 5 wherein:

said inner end portion of said support structure has a plurality of openings formed therein, and said body portion has a plurality of resilient tab portions releasably snap-fitted into said plurality of openings.

8. The electronic apparatus of claim 1 wherein:

said support structure is a support tray structure, and said inner end portion is defined by an upstanding inner end wall of said support tray structure.

9. The electronic apparatus of claim 1 wherein said circuit board is a CPU card.

10. The electronic apparatus of claim 1 wherein:

said electronic apparatus further comprises a second circuit board carried by said support structure for movement therewith, and said latch structure has a second support section releasably engaging and supporting a portion of said second circuit board.

11. Electronic apparatus comprising:

a housing having a first exterior side portion with a first opening therein;

a support structure movable into and out of the interior of said housing through said first opening;

a first circuit board carried by said support structure for movement therewith, said first circuit board being removable from said support structure in a first direction;

a latch structure carried by said support structure for movement therewith and being positioned and configured to cooperate with said housing in a manner releasably preventing the removal of said support structure outwardly through said first opening, said latch structure having a first support section releasably engaging and supporting a first portion of said first circuit board; and a retainer structure removably secured to said support structure and blocking the removal of said first circuit board therefrom in said first direction, said retainer structure being of a toolless construction permitting it to be manually installed on and removed from said support structure without using a tool, said retainer structure further having a second support section releasably engaging and supporting a second portion of said first circuit board.

12. The electronic apparatus of claim 11 wherein:

said support structure has an inner end portion, said housing further has a second exterior side portion with a second opening therein, said second exterior side portion being spaced apart from and generally facing said first exterior side portion, and said electronic apparatus further comprises a receiving structure secured to said inner support structure end portion for removal therewith from said housing and disposed adjacent said second opening, said receiving structure being configured to operatively and removably receive a computer card inserted inwardly through said second opening when said support structure is in a fully inserted operative position within said housing, whereby computer card installation and removal access to said receiving structure is provided at each of said first and second exterior side portions of said housing.

13. The electronic apparatus of claim 12 wherein said electronic apparatus is a computer apparatus.

14. The electronic apparatus of claim 13 wherein said computer apparatus is a router.

15. The electronic apparatus of claim 12 wherein said receiving structure is a PCMCIA card receiving structure.

16. The electronic apparatus of claim 11 wherein said first portion of said first circuit board is an edge portion thereof.

17. The electronic apparatus of claim 16 wherein:

said electronic apparatus further comprises a second circuit board carried by said support structure for movement therewith, and said latch structure further has a second support section releasably engaging and supporting an edge portion of said second circuit board.

18. The electronic apparatus of claim 11 wherein said support structure is a support tray structure.

19. The electronic apparatus of claim 11 wherein:

said support structure has first and second portions spaced apart in a second direction parallel to the plane of said first circuit board and transverse to said first direction, and said retainer structure has an elongated body portion with first and second opposite ends, a first connection structure carried on said first end and being releasably interlockable with said first support structure portion, and a second connection structure carried on said second end and being releasably interlockable with said second support structure portion.

20. The electronic apparatus of claim 19 wherein said second support section releasably engages an edge portion of said first circuit board.

21. Electronic apparatus comprising:

a housing;

a support structure removably disposed in said housing and having spaced apart parallel first and second wall portions;

a circuit board mounted on said support structure and being removable therefrom in a first direction parallel to the plane of said circuit board, said circuit board being positioned between said first and second wall portions and having a side edge portion extending transversely to said first and second wall portions; and a retainer structure removably secured to said support structure and blocking the removal of said circuit board therefrom in said first direction, said retainer structure being of a toolless construction permitting it to be manually installed on and removed from said support structure without using a tool, said retainer structure including:

an elongated body portion having first and second opposite ends and longitudinally extending parallel to said side edge portion of said circuit board, a channel section carried by said elongated body portion and extending along and removably receiving essentially the entire length of said side edge portion of said circuit board, and means for removably securing said first and second opposite ends of said elongated body portion respectively to said first and second wall portions of said support structure in a manner permitting said elongated body portion to be removed from said support structure by sequentially disconnecting said first end of said elongated body portion from said first wall portion of said support structure and then longitudinally moving said elongated body portion relative to said support structure to disconnect said second end of said elongated body portion from said second wall portion of said support structure.

22. The electronic apparatus of claim 21 wherein said electronic apparatus is a computer apparatus.

23. The electronic apparatus of claim 22 wherein said computer apparatus is a router.

24. The electronic apparatus of claim 21 wherein:
said first and second wall portions of said support structure have openings therein, and
said means for removably securing include an expandable grommet member carried by said first end of said elongated body portion and removably received in said first wall portion opening, and a retaining tab member formed on said second end of said elongated body portion and removably received in said second wall portion opening.

* * * * *